United States Patent [19]
Kozaru et al.

[11] Patent Number: 5,612,917
[45] Date of Patent: Mar. 18, 1997

[54] SEMICONDUCTOR MEMORY DEVICE INCLUDING IMPROVED REDUNDANCY CIRCUIT

[75] Inventors: Kunihiko Kozaru; Koreaki Fujita, both of Hyogo, Japan

[73] Assignee: Mitsubishi Denki Kabushiki Kaisha, Tokyo, Japan

[21] Appl. No.: 417,171

[22] Filed: Apr. 5, 1995

[30] Foreign Application Priority Data

Apr. 12, 1994 [JP] Japan .................................. 6-073410

[51] Int. Cl.$^6$ .............................. G11C 7/00; G11C 29/00
[52] U.S. Cl. ................ 365/200; 365/225.7; 365/230.03
[58] Field of Search ................................ 365/200, 225.7, 365/230.03; 371/10.1, 10.2

[56] References Cited

U.S. PATENT DOCUMENTS

| | | | |
|---|---|---|---|
| 5,357,470 | 10/1994 | Namekawa et al. | 365/200 |
| 5,392,247 | 2/1995 | Fukita . | |
| 5,475,648 | 12/1995 | Fujiwara | 365/230.03 |
| 5,487,039 | 1/1996 | Sukegawa | 365/230.03 |

FOREIGN PATENT DOCUMENTS 5-198199A 8/1993 Japan .

Primary Examiner—David C. Nelms
Assistant Examiner—Huan Hoang
Attorney, Agent, or Firm—Lowe, Price, LeBlanc & Becker

[57] ABSTRACT

A dynamic random access memory includes memory cell array blocks, row decoders, redundant word lines, redundant memory cells, replacement circuits, and a normal memory cell de-select circuit. Each memory cell array block includes normal word lines and normal memory cells. Each row decoder is provided corresponding to one memory cell array block. Any of the redundant word line is provided corresponding to one memory cell array block. Each replacement circuit includes a redundancy select circuit, a replacement address program circuit, and a redundant word line select circuit. The redundancy select circuit has set in advance whether a corresponding redundant word line is to be used or not. The program circuit has an address programmed of a normal word line to be replaced with a corresponding redundant word line. The normal memory cell de-select circuit inactivates a row decoder in response to an output of the replacement circuit when any replacement circuit selects a corresponding redundant word line. When a corresponding redundant word line is not used, a predecode signal is distributed to a program circuit so that the loads of a predecode signal are equal to each other.

8 Claims, 7 Drawing Sheets

SEMICONDUCTOR MEMORY DEVICE INCLUDING IMPROVED REDUNDANCY CIRCUIT

BACKGROUND OF THE INVENTION

1. Field of the Invention

The present invention relates to semiconductor devices, and more particularly, to a semiconductor device including a redundancy circuit.

2. Description of the Background Art

A semiconductor memory device including a redundancy circuit is developed for improving the yield of semiconductor memory devices. The usage of a redundancy circuit allows a word line to be replaced with a redundant word line when that certain word line or a memory cell connected to that certain word line is defective. Thus, defective word lines or memory cells can be repaired.

FIG. 4 is a block diagram showing a structure of the main components of a conventional semiconductor memory device including a redundancy circuit.

A memory cell array 1 includes a plurality of word lines WL, a plurality of bit line pairs BL crossing the plurality of word lines WL, and a plurality of memory cells MC provided at the crossings thereof. This memory cell array 1 further includes a redundant word line RWL, and a plurality of memory cells MC connected thereto.

A decoder 2 and a sense amplifier unit 13 are connected to memory cell array 1. Sense amplifier unit 13 includes a plurality of sense amplifiers and transfer gates connected to the plurality of bit line pairs BL, and a decoder.

The present semiconductor memory device includes a replacement circuit 10. Replacement circuit 10 includes a redundancy select circuit 3, a replacement address program circuit 4, and an NAND circuit 5. Replacement circuit 10 and a redundant word line RWL form a redundancy circuit.

The operation of the semiconductor memory device of FIG. 4 will be described hereinafter.

Decoder 2 responds to an X address XA to select one of the plurality of word lines WL in memory cell array 1 to pull up the potential of the selected word line WL to an H level (logical high). This causes data to be read out to a corresponding bit line pair BL from a memory cell MC connected to the selected word line WL. These data are amplified by a sense amplifier included in sense amplifier unit 13. The decoder in sense amplifier unit 13 responds to a Y address signal YA to render one of the plurality of transfer gates conductive. As a result, one data is output.

When there is a fault concerning a certain word line WL, a redundant word line RWL is used as a substitute for that word line WL. In this case, the output of redundancy select circuit 3 attains an H level. Also, the address of a word line WL to be replaced is programmed in replacement address program circuit 4.

When the address specified by X address signal XA matches the address (replacement address) programmed in replacement address program circuit 4, the output of replacement address program circuit 4 attains an H level. When the outputs of redundancy select circuit 3 and replacement address program circuit 4 attain an H level, the output of NAND circuit 5 (data inactive signal DA) is pulled down to an L level (logical low). This renders the decoder inactive, whereby all the word lines WL attain a de-selected state. The potential of redundant word line RWL is pulled up to an H level.

Thus, when a defective word line WL or a word line WL connected to a defective memory cell MC is selected, a redundant word line RWL is selected instead of that word line WL.

Although memory cell array 1 may include a redundant bit line pair, such a redundant bit line pair is omitted in FIG. 4.

FIG. 5 is a circuit diagram showing a detailed structure of redundancy select circuit 3. Redundancy select circuit 3 includes a fuse 31, an MOS capacitor 32, a high resistor 33, P channel transistors 34, 35, and an N channel transistor 36.

In a normal mode, i.e. when a redundant word line RWL is not used (redundancy de-selected), fuse 31 attains a connected state. Therefore, the potential of a node N1 attains a ground level, so that a signal of an L level enters NAND circuit 5 of FIG. 4. As a result, data inactive signal DA attains an H level, so that the potential of redundant word line RWL is not pulled up.

When redundant word line RWL is used (redundancy selected), fuse 31 is disconnected. When power is turned on, the potential of node N1 rises to an H level by the current flowing in high resistor 33 when the increasing level of the power supply voltage is moderate. When the increasing level of the powers supply voltage is abrupt, the potential of node N1 rises towards an H level by the capacitive coupling of MOS capacitor 32. Furthermore, the potential of node N1 arrives at a complete H level by the positive feedback circuit formed of transistors 34, 35 and 36.

Thus, the output of redundancy select circuit 3 attains an L level and an H level when redundancy is de-selected and selected, respectively.

FIG. 6 is a circuit diagram showing a detailed structure of replacement address program circuit 4. An address setting circuit 40 includes a fuse 41, an MOS capacitor 42, a high resistor 43, P channel transistors 44, 45, and an N channel transistor 46. An address setting circuit 50 includes a fuse 51, an MOS capacitor 52, a high resistor 53, P channel transistors 54, 55, and an N channel transistor 56. The structure and operation of address setting circuits 40 and 50 are similar to those of the redundancy select circuit 3 shown in FIG. 5.

Therefore, the potential of node N3 of address setting circuit 4 attains an L level and an H level when fuse 41 is connected and disconnected, respectively. Similarly, the potential of node N5 of address setting circuit 50 attains an L level and an H level when fuse 51 is connected and disconnected, respectively.

P channel transistors 61 and 62 and N channel transistors 71 and 72 are connected between an input terminal I1 and an output terminal O1. P channel transistors 63 and 64 and N channel transistors 73 and 74 are connected between an input terminal I2 and an output terminal O1. P channel transistors 65 and 66 and N channel transistors 75 and 76 are connected between an input terminal I3 and output terminal O1. P channel transistors 67 and 68 and N channel transistors 77 and 78 are connected between an input terminal I4 and output terminal O1.

The gate electrodes of transistors 61, 73, 65 and 77 are connected to a node N3 in address setting circuit 40. The gate electrodes of transistors 71, 63, 75 and 67 are connected to a node N4 of address setting circuit 40. The gate electrodes of transistors 62, 64, 76 and 78 are connected to a node N5 of address setting circuit 50. The gate electrodes of transistors 72, 74 and 66 and 68 are connected to a node N6 of address setting circuit 50.

A predecode signal which is a predecoded version of X address signal XA is programmed in replacement address program circuit 4 of FIG. 6. The programming method in program circuit 4 will be described hereinafter.

First, predecode signals X0·X1, X0·/X1, /X0·X1, and /X0·/X1 are defined as follows:

When X0=H level and X1=H level, X0·X1=H level

When X0=H level and X1=L level, X0·/X1=H level

When X0=L level and X1=H level, /X0·X1=H level

When X0=L level and X1=L level, /X0·/X1=H level

Otherwise, each of predecode signals X0·X1, X0·/X1, /X0·X1, and /X0·/X1 attains an L level.

Here, predecode signal X0·X1 is applied to input terminal I1. predecode signal X0·/X1 is applied to input terminal I2, predecode signal /X0·X1 is applied to input terminal I3, and predecode decode signal /X0·/X1 is applied to input terminal I4.

When fuses 41 and 51 are connected, only input terminal I1 is connected to output terminal O1. As a result, predecode signal X0·X1 appears at output terminal O1. Therefore, when X0=H level and X1=H level, the output attains an H level. Since redundant word line RWL is selected here, an address of X0=X1=H level is programmed in replacement address program circuit 4 by fuses 41 and 51.

Similarly, X0·/X1 appears at output terminal O1 when fuse 41 is disconnected and fuse 51 is connected. Therefore, an address of X0=H level, X1=L level is programmed. When fuse 41 is connected and fuse 51 is disconnected, /X0·X1 appears at output terminal O1. Therefore, an address of X0=L level, X1=H level is programmed. When fuses 41 and 51 are disconnected, X0·/X1 appears at output terminal O1. Therefore, an address of X0=X1=L level is programmed.

In replacement address program circuit 4 of FIG. 6, four predecode signals X0·X1, X0·/X1, /X0·X1, and /X0·/X1 which are two X address signals X0 and X1 predecoded are applied. There are generally more than four X address signals. Therefore, a plurality of the circuits shown in FIG. 6 are provided, wherein the output of each circuit is applied to NAND circuit 5 shown in FIG. 4.

When memory cell arrayl is divided into a plurality of memory blocks, a redundant word line RWL is provided in each memory block. If only one replacement circuit 10 of FIG. 4 is provided, only one defect can be repaired even though there are a plurality of redundant word lines RWL corresponding to the number of memory blocks.

U.S. Pat. No. 5,392,247 discloses a semiconductor memory device including a replacement circuit for each memory block to solve such a problem.

FIG. 7 is a block diagram showing a structure of four replacement address program circuits 4a–4d in four replacement circuits 10 provided for every memory block.

When there is no defect, it is not necessary to program a replacement address in any of the four replacement address program circuits 4a–4d shown in FIG. 7. Therefore, fuses 41 and 51 in address setting circuits 40 and 50 are not disconnected. As a result, transistors 61, 62, 71 and 72 in all the replacement address program circuits 4a–4d attain a conductive state, whereby predecode signal X0·X1 applied to input terminal I1 will always appear at respective output terminals O1a–O1d.

This means that, when a redundant word line RWL is not used, only one predecode signal X0·X1 out of the four predecode signals must charge the negative capacitance of the four output terminals O1a–O1d. Therefore, the load to be driven by a particular predecode signal X0·X1 becomes larger as the number of replacement circuits 10 increases. As a result, there is a great difference between the load of a certain predecode signal X0·X1 and that of another predecode signal. Thus, there was a problem that only the rising time or falling time of a predecode signal X0·X1 is increased.

SUMMARY OF THE INVENTION

In view of the foregoing, an object of the present invention is to provide a semiconductor memory device in which an increase of the load of only one address signal or a predecode signal is suppressed.

Another object of the present invention is to provide a semiconductor conductor memory device in which an increase in only the rising time or the falling time of one address signal or a predecode signal is suppressed.

A further object of the present invention is to provide a semiconductor memory device in which the rising time or the falling time of an address signal or a predecode signal is made equal.

A semiconductor memory device according to an aspect of the present invention includes a plurality of memory cell array blocks, a plurality of first select circuits, a plurality of redundant select lines, a plurality of redundant memory cells, a plurality of redundancy circuits, and an inactivation circuit. The plurality of memory cell array blocks include a plurality of select lines, and a plurality of memory cells connected to the plurality of select lines and arranged in a matrix of rows and columns. The plurality of first select circuits are provided corresponding to the plurality of memory cell array blocks. Each first select circuit selects one of the plurality of select lines in a corresponding memory cell block in response to an externally applied plurality of address signals. One or some of the plurality of redundant select lines are provided corresponding to each of the plurality of memory cell array blocks. The plurality of redundant memory cells are connected to a plurality of redundant select lines. The plurality of redundancy circuits are provided corresponding to the plurality of memory cell array blocks. Each of the plurality of redundancy circuits includes a setting circuit, a program circuit, and a second select circuit. The setting circuit is set in advance as to whether the corresponding one or some of the redundant select lines are to be used or not. In a first case where the corresponding one or some redundant select lines are not used, the program circuit selects and outputs any of a plurality of address signals. When in a second case where the corresponding one or some redundant select lines are used, the program circuit selects and outputs an address signal that specifies the address of a select line that is to be replaced with the redundant select line to be used. The second select circuit selects a corresponding one or some redundant select lines in response to the setting circuit and an output of the program circuit. The inactivation circuit responds to an output of the plurality of redundancy circuits to inactivate the plurality of first select signals when a corresponding one or some redundant select lines are selected by any of the plurality of redundancy circuits. One program circuit in the plurality of redundancy circuit selects an address signal other than the address signal selected by another one program circuit in the first case.

According to the semiconductor memory device of the present invention, one program circuit selects an address signal other than the address signal selected by another one program circuit in the first case. Therefore, there is no possibility of the load of only one address signal being increased, and only the rising time or the falling time of one address signal being increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
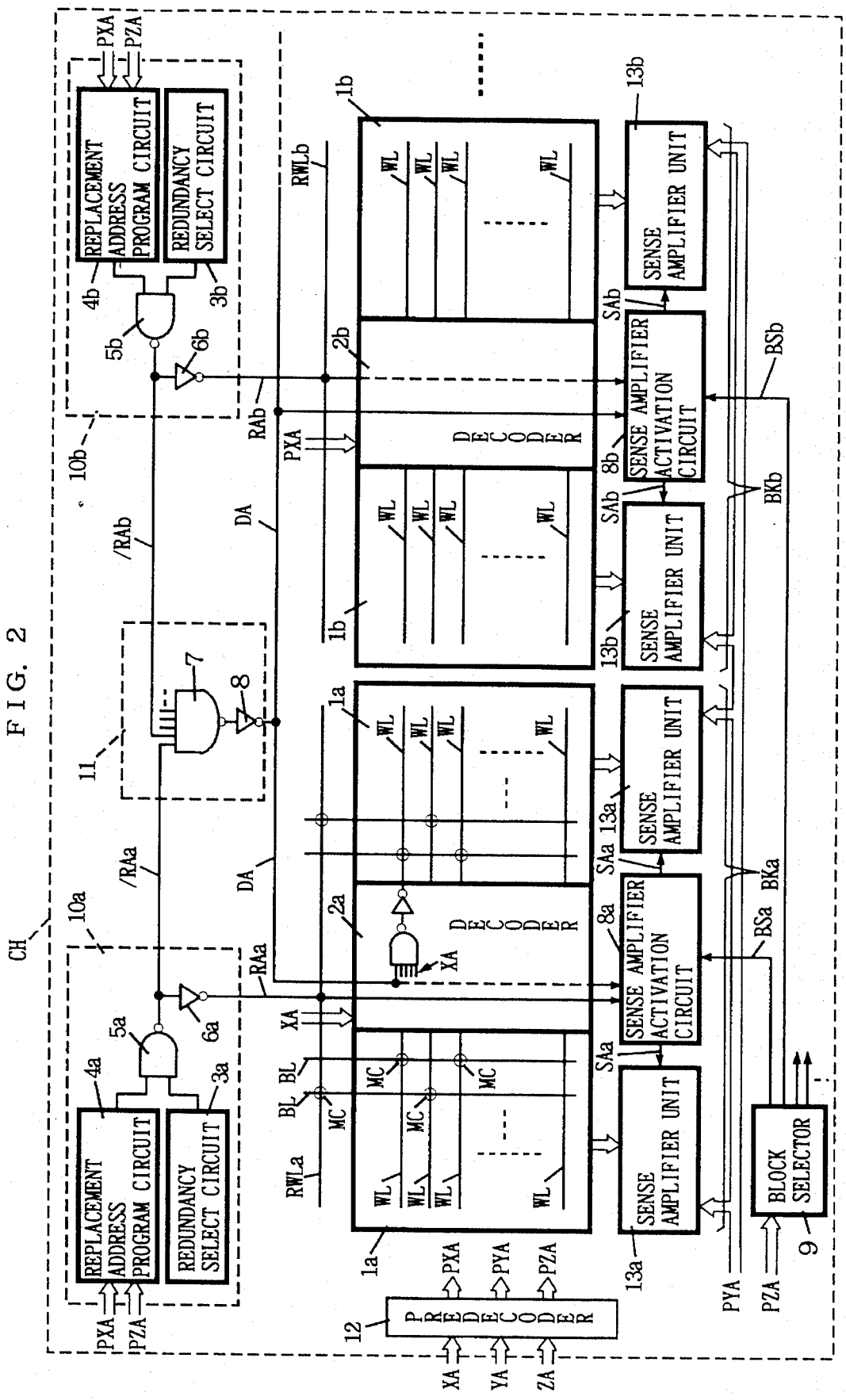
FIG. 2 is a block diagram showing the entire structure of the semiconductor memory device of FIG. 1.

An embodiment of the present invention will be described hereinafter with reference to the drawings. FIG. 2 is a block diagram showing the entire structure of a semiconductor memory device including a redundancy circuit according to an embodiment of the present invention. This semiconductor memory device is formed on a chip CH.

The present semiconductor memory device includes a plurality of memory blocks. In FIG. 2, only two memory blocks BKa and BKb are shown. Memory block BKa includes a memory cell array block 1a, a decoder 2a, a sense amplifier unit 13a, and a sense amplifier activation circuit 8a. Similarly, memory block BKb includes a memory cell array block 1b, a decoder 2b, a sense amplifier unit 13b, and a sense amplifier activation circuit 8b.

Each of memory cell array blocks 1a and 1b includes a plurality of word lines WL, a plurality of bit line pairs BL, and a plurality of memory cells MC provided at the crossings thereof. Each of sense amplifier units 13a and 13b includes a plurality of sense amplifiers connected to the plurality of bit line pairs BL, a plurality of transfer gates (not shown), a decoder, and a line driver.

A replacement circuit 10a and a redundant word line RWLa are provided corresponding to memory block BKa. A replacement circuit 10b and a redundant word line RWLb are provided corresponding to memory block BKb. A redundant memory cell MC is connected also to redundant word lines RWLa and RWLb.

Replacement circuit 10a includes a redundancy select circuit 3a, a replacement address program circuit 4a, an NAND circuit 5a and an inverter 6a. Similarly, replacement circuit 10b includes a redundancy select circuit 3b, a replacement address program circuit 4b, an NAND circuit 5b and an inverter 6b.

Figure 5:
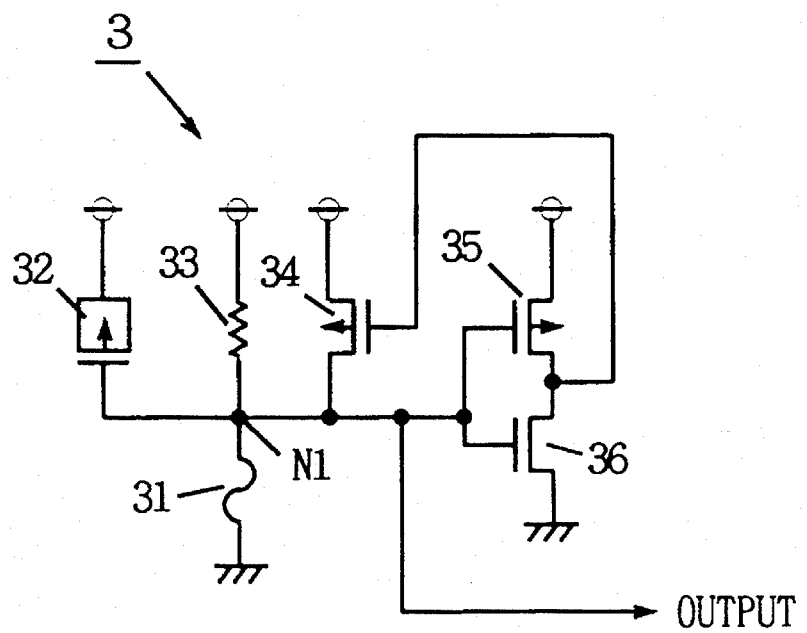
FIG. 5 is a circuit diagram showing a specific structure of the redundancy select circuit of FIG. 4.

Replacement circuit 10a and redundant word line RWLa form a redundancy circuit corresponding to memory block BKa, and replacement circuit 10b and redundant word line RWLb form a redundancy circuit corresponding to memory block BKb. The structure and operation of each of redundancy select circuits 3a and 3b are similar to those of the redundancy select circuit 3 shown in FIG. 5. The structure and operation of each of replacement address program circuits 4a and 4b are similar to those of the replacement address program circuit 4 shown in FIG. 6.

A normal memory cell de-select circuit 11 is commonly provided in all memory blocks BKa and BKb. Normal memory cell de-select circuit 11 includes an NAND circuit 7 and an inverter 8.

The present semiconductor memory device further comprises a predecoder 12. Predecoder 12 predecodes a plurality of X addresses XA to generate a plurality of predecode signals PXA. Predecoder 12 further generates a plurality of predecode signals PXA which are predecoded versions of a plurality of Y address signals YA. Predecoder 12 also predecodes a plurality of Z address signals ZA to generate a plurality of predecode signals PZA.

The plurality of predecode signals PXA are applied to each of decoders 2a and 2b, as well as to each of replacement address program circuits 4a and 4b. Predecode signal PYA is applied to each of sense amplifier units 13a and 13b. Predecode signal (block address signal) PZA is applied to block selector 9 as well as to each of replacement address program circuits 4a and 4b.

Figure 1:
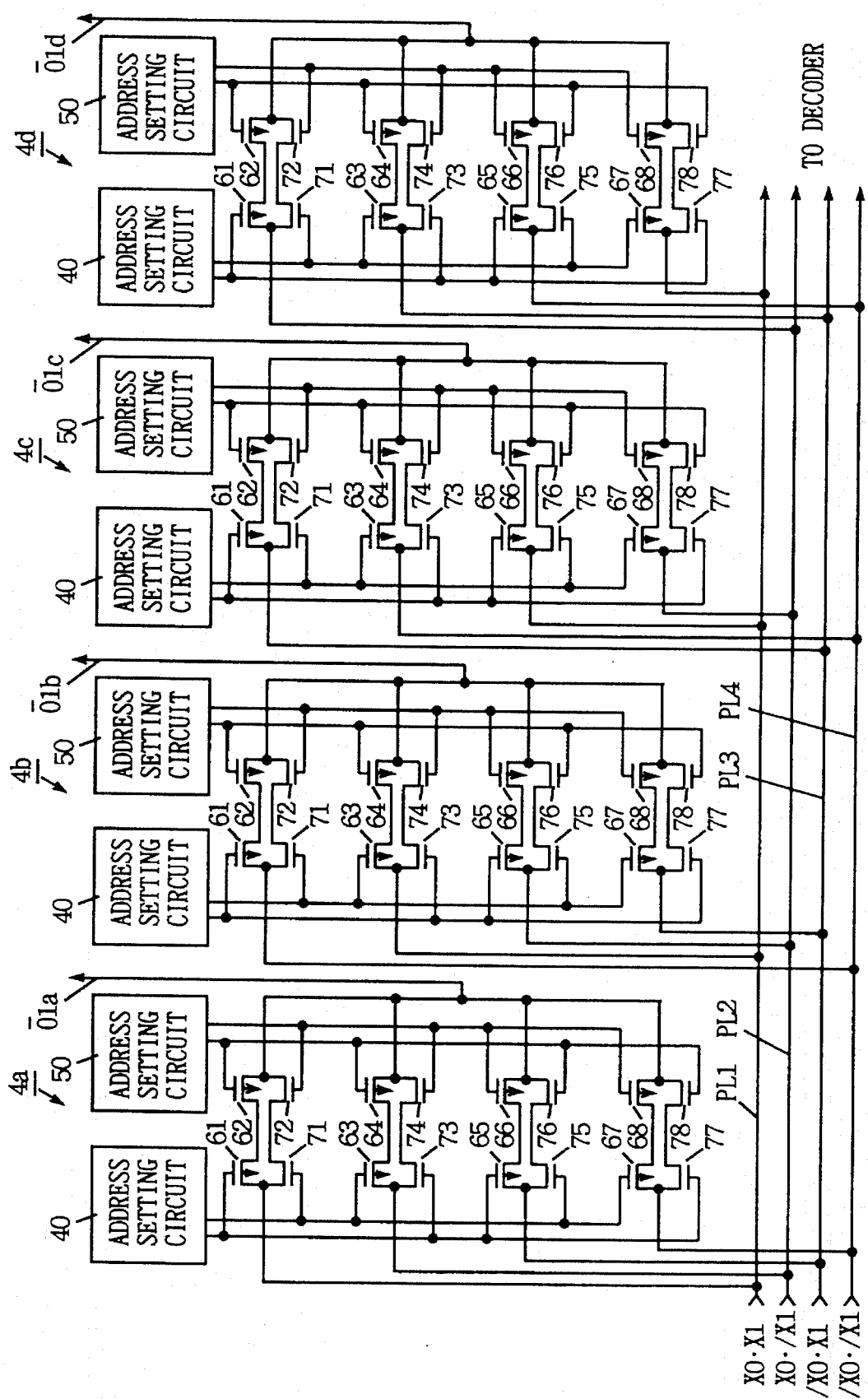
FIG. 1 is a block diagram showing a structure of the main components of a semiconductor memory device according to an embodiment of the present invention.

FIG. 1 is a wiring diagram showing the structure of four replacement address program circuits corresponding to four memory blocks in the present semiconductor memory device.

Referring to FIG. 1, transistors 61 and 71 in replacement address program circuit 4a are connected to predecode signal line PL1 to which predecode signal X0·X1 is supplied. Transistors 63 and 73 in replacement address program circuit 4a is connected to a predecode signal line PL2 to which predecode signal X0·/X1 is supplied. Transistors 65 and 75 in replacement address program circuit 4a is connected to a predecode signal line PL3 to which predecode signal /X0·X1 is supplied. Transistors 67 and 77 in replacement address program circuit 4a is connected to a predecode signal line PL4 to which predecode signal /X0·/X1 is supplied.

In replacement address program circuit 4b, transistors 61 and 71 are connected to predecode signal line PL4, transistors 63 and 73 to predecode signal PL1, transistors 65 and 75 to predecode signal line PL2, and transistors 67 and 77 to predecode signal line PL3.

In replacement address program circuit 4c, transistors 61 and 71 are connected to predecode signal line PL3, transistors 63 and 73 to predecode signal line PL4, transistors 65 and 75 to predecode signal line PL1, and transistors 67 and 77 to predecode signal line PL2.

In replacement address program circuit 4d, transistors 61 and 71 are connected to predecode signal line PL2, transistors 63 and 73 to predecode signal line PL3, transistors 65 and 75 to predecode signal line PL4, and transistors 67 and 77 to predecode signal line PL1.

Figure 7:
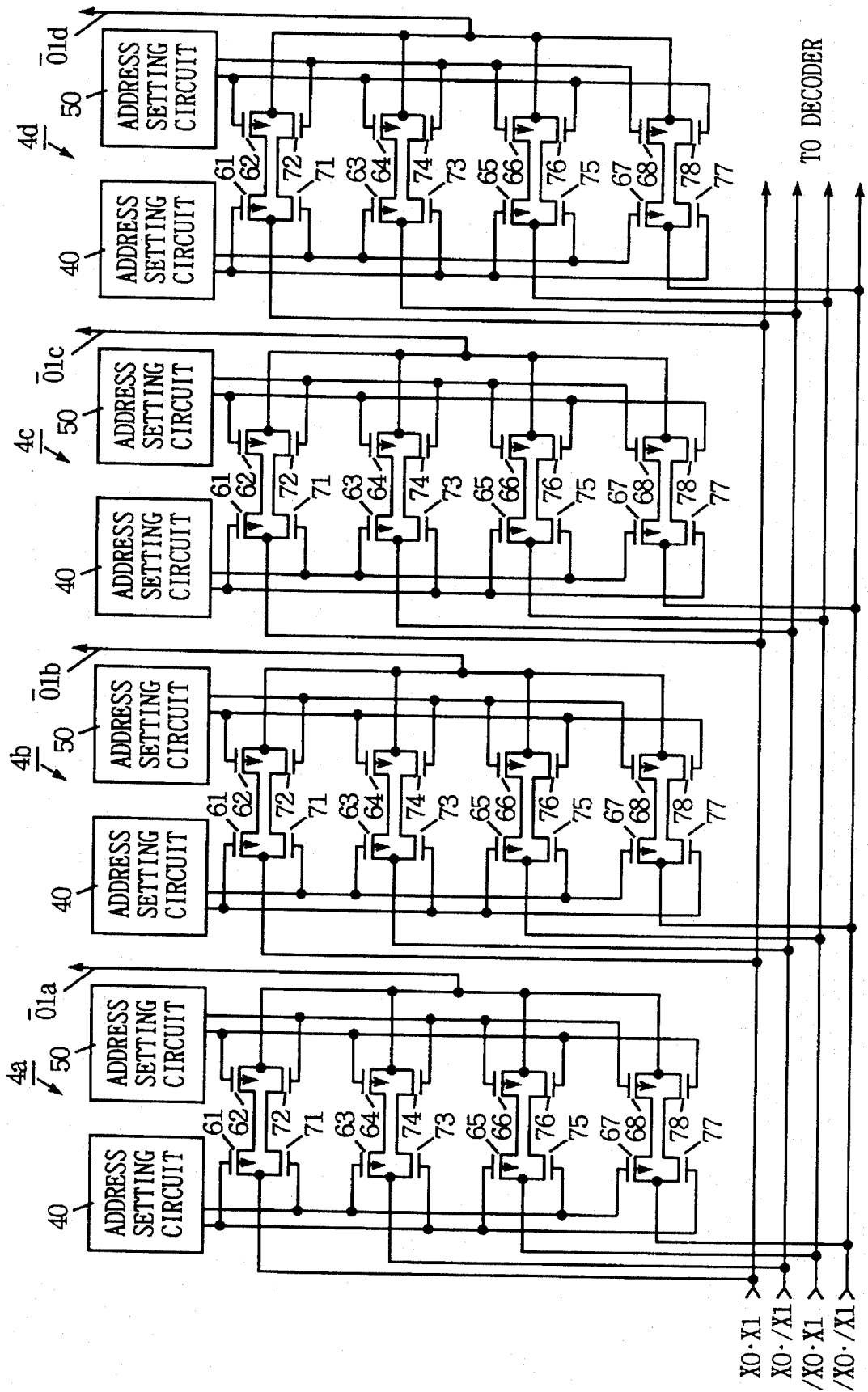
FIG. 7 is a block diagram showing a structure of the main components in a semiconductor memory device including a plurality of the memory cell array blocks of FIG. 4.

The above-described connection differs from the conventional connection shown in FIG. 7. This connection is the feature of the present embodiment. Although only four predecode signals X0·X1, X0·/X1, /X0·X1, and /X0·/X1 are shown in FIG. 1, the same applies for other predecode signals, as well as to predecode signal PZA which is a predecoded version of Z address signal ZA.

Referring to FIG. 2 again, outputs of redundancy select circuit 3a and replacement address program circuit 4a are applied to input terminals of NAND circuit 5a. An output signal /RAa of NAND circuit 5a is applied to one input terminal of NAND circuit 7 of normal memory cell deselect circuit 11 and also to inverter 6a. The output of inverter 6a is applied to redundant word line RWLa and sense amplifier activated circuit 8a as word line activation signal RAa.

Similarly, outputs of redundancy select circuit 3b and replacement address program circuit 4b are applied to input terminals of NAND circuit 5b. An output signal /RAb of NAND circuit 5b is applied to another one input terminal of NAND circuit 7 of normal memory cell de-select circuit 11 and to inverter 6b. The output of inverter 6b is applied to redundant word line RWLb and to sense amplifier activation circuit 8b as redundant word line activation signal RAb.

Two or more input terminals of NAND circuits 5a and 5b are required when there are more than one output of replacement address program circuits 4a and 4b.

In contrast, the output of normal memory cell deselect circuit 11 is applied to decoders 2a and 2b and sense amplifier activation circuits 8a and 8b as a decoder inactivation signal DA. Sense amplifier activation circuit 8a responds to a block select signal BSa, a redundant word line activation signal RAa, and a decoder inactivation signal DA to provide a sense amplifier inactivation signal SAa to sense amplifier 13a. Similarly, sense amplifier activation circuit 8b responds to a block select signal BSb, a redundant word line activation signal RAb and a decoder inactivation signal DA to provide a sense amplifier activation signal SAb to sense amplifier unit 13b.

Figure 3:
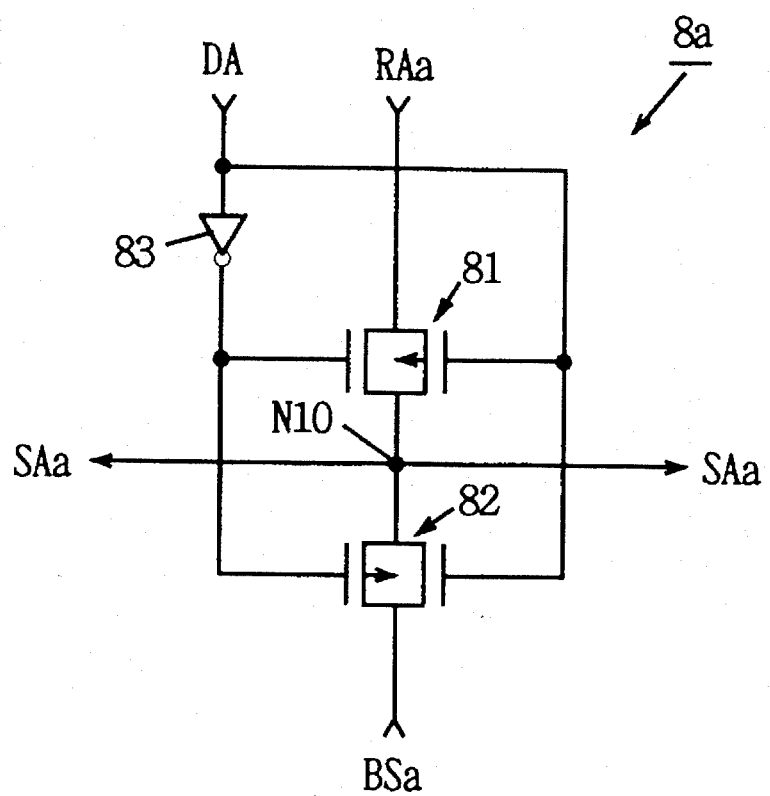
FIG. 3 is a circuit diagram showing a specific structure of the sense amplifier activation circuit of FIG. 2.
Figure 4:
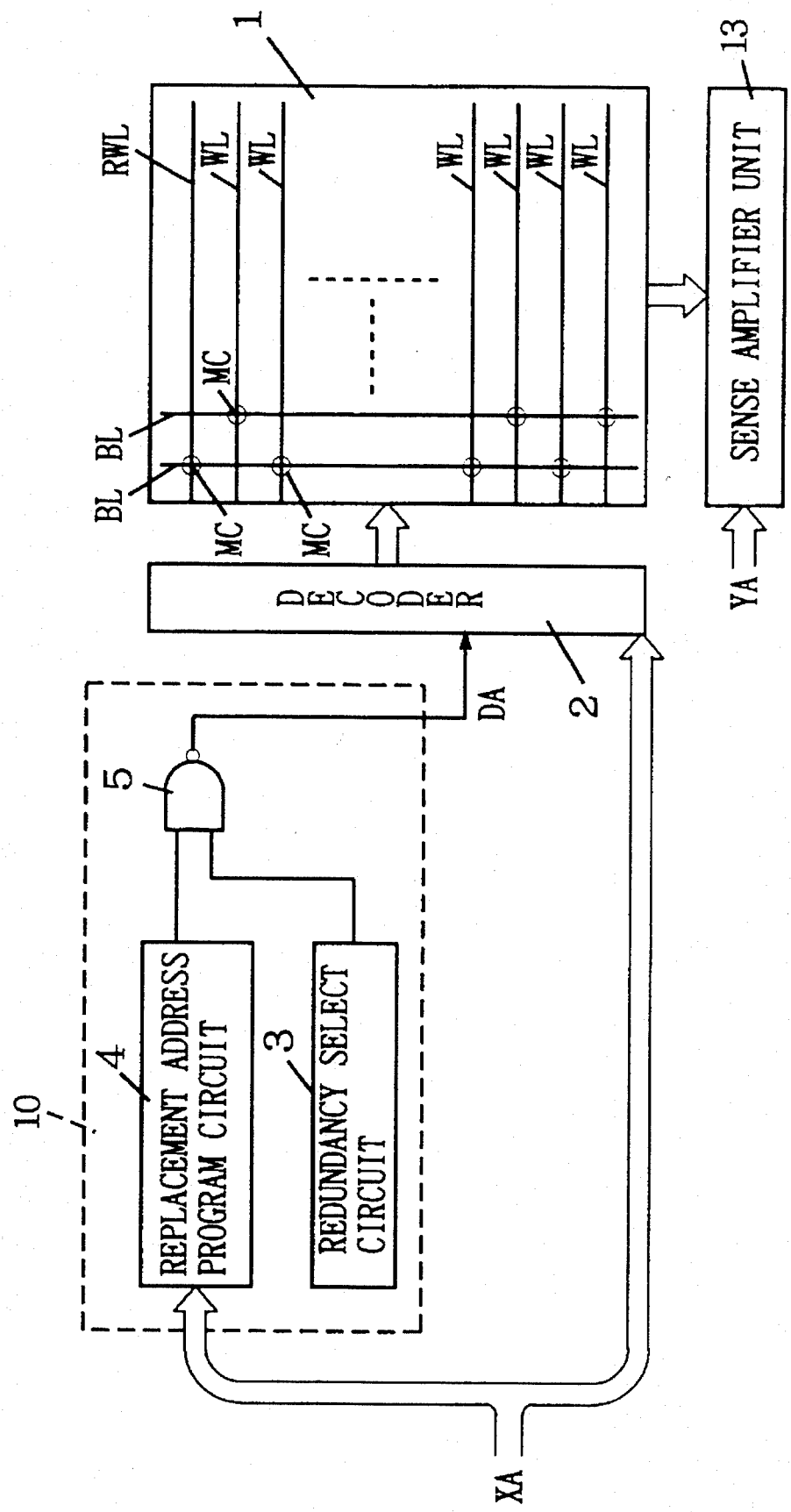
FIG. 4 is a block diagram showing a structure of a conventional semiconductor memory device.

FIG. 3 is a circuit diagram showing in detail the structure of sense amplifier activation circuit 8a. Referring to FIG. 3, sense amplifier activation circuit 8a includes CMOS transfer gates 81 and 82, and an inverter 83.

When decoder inactivation signal DA attains an L level, CMOS transfer gate 81 is rendered conductive and CMOS transfer gate 82 is rendered non-conductive. This causes redundant word line activation signal RAa to be output from node N10 as sense amplifier activation signal SAa. When decoder inactivation signal DA attains an H level, CMOS transfer gate 81 is rendered non-conductive and CMOS transfer gate 82 is rendered conductive. This causes block select signal BSa to be output from node N10 as sense amplifier activation signal SAa.

The structure and operation of sense amplifier activation circuit 8b are similar to those of sense amplifier activation circuit 8a.

The operation of the semiconductor memory device shown in FIG. 2 will be described hereinafter.

When all the redundant word lines RWLa, RWLb, . . . are not used (redundancy de-selected), outputs of redundancy circuit select circuits 3a and 3b attain an L level, and the outputs of NAND circuits 5a and 5b attain an H level. Therefore, redundant word line activation signals RAa and RAb attain an L level, and decoder inactivation signal DA attain an H level. As a result, decoders 2a and 2b attain an active state. Block select signals BSa and BSb are output from sense amplifier activation circuits 8a and 8b as sense amplifier activation signals SAa and SAb.

For example, when memory block BKa is specified in response to predecode signal PZA which is a predecoded version of Z address signal ZA, block select signal BSa attains an H level and block select signal BSb attains an L level. This causes sense amplifier unit 13a to attain an active state and sense amplifier unit 13b to attain an inactive state. Decoder 2a responds to predecode signal PXA which is a predecoded version of X address signal XA to select one of the plurality of word lines WL in memory cell array block 1a, whereby the potential of the selected word line is pulled up to an H level. As a result, data is read out from memory cell MC connected to that word line WL to a corresponding bit line pair BL.

In a read out operation, those data are amplified by a sense amplifier in sense amplifier unit 13a. The decoder in sense amplifier unit 13a responds to predecode signal PYA which is a predecoded version of Y address signal YA to render conductive one of the plurality of transfer gates. As a result, one data is output. Here, redundant word line RWLa and RWLb are not selected since redundant word line activation signals RAa and RAb attain an L level.

Figure 6:
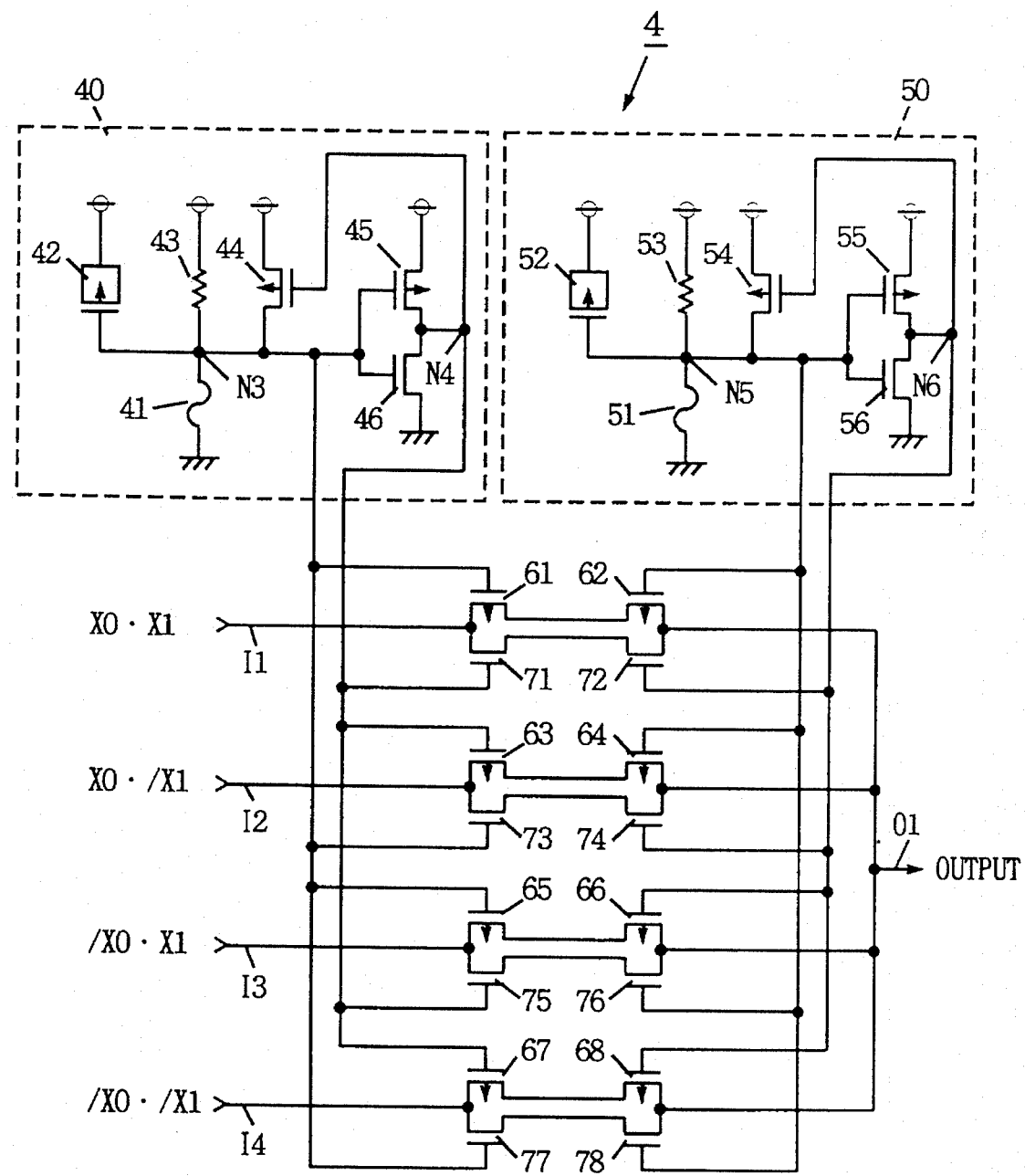
FIG. 6 is a circuit diagram showing a specific structure of the replacement address program circuit of FIG. 4.

Referring to FIGS. 1 and 6, when in a redundancy deselected mode, only transfer gates 61, 71 and 62, 72 in all the replacement address program circuits 4a and 4d are rendered conductive. More specifically, since fuses 41 and 51 in address setting circuits 40 and 50 are not disconnected, node N3 and node N4 in address setting circuit 40 attain an L level and an H level, respectively. In address setting circuit 50, node N5 attains an L level, and node N6 attains an H level.

Therefore, in all the replacement address program circuits 4a–4d, transfer gates 61, 71 and 62, 72 attain a conductive state, and all the other transistors 63, 73 and 64, 74, 65, 75, and 66, 76, and transistors 67, 77 and 68, 78 attain a non-conductive state.

As a result, in replacement address program circuit 4a, only predecode signal X0·X1 are transferred to output terminal O1a via transfer gates 61, 71 and 62, 72. In replacement address program circuit 4b. only predecode signal /X0·/X1 is transferred to output terminal O1b via a transfer gates 61, 71 and 62, 72. In replacement address program circuit 4c, only predecode signal /X0·X1 is transferred to output terminal O1 c via transfer gates 61, 71 and 62, 72. In replacement address program circuit 4d, only predecode signal X0·/X1 is transferred to output terminal O1d via transfer gates 61, 71 and 62, 72.

Thus, when all the redundant word lines RWLa, RWLb, . . . are not used, each of replacement address program circuits 4a–4d selects and outputs one of four predecode signals X0·X1, X0·/X1, /X0·X1, and /X0·/X1. Each of replacement address program circuits 4a–4d selects a predecode signal that is not selected by the other replacement address program circuits. More specifically, each of predecode signals X0·X1, X0·/X1, /X0·X1, and /X0·/X1 is selected by one of replacement address program circuits 4a–4d.

This means that the load of these four predecode signals X0·X1, X0·/X1, /X0·X1, and /X0·/X1 is equal to each other. Therefore, the rising time and the falling time thereof is equal.

Although one predecode signal X0·X1, X0·/X1, /X0·X1, or /X0·/X1 is provided from each of replacement address program circuits 4a–4d even at a redundancy de-selected mode, the outputs of NAND circuits 5a, 5b. . ., always attain an H level since a signal of an L level is output from redundancy select circuits 3a, 3b. . .. Therefore, redundant word lines RWLa, RWLb, . . . will not be selected.

When any of redundant word lines RWLa, RWLb is used (redundancy selected), any of redundancy select circuits 3a, 3b attains an H level. When redundancy word line RWLa, for example, is used, the output of redundancy select circuit 3a attains an H level.

In replacement address program circuit 4a. the address of a word line WL to be replaced (replacement address) is programmed. More specifically, any of fuses 41 and 51 in address setting circuits 40 and 50 is appropriately disconnected. It is to be noted that both fuses 41 and 51 are not disconnected when predecode signal X0·X1 specifies a replacement address.

The programming of an address of a word line WL in replacement address program circuit 4a is not limited to that within memory block BKa, and an address of a word line WL in another memory block BKb can also be programmed.

When the address specified by predecode signals PXA and PZA does not match the replacement address programmed in replacement address program circuit 4a, the output of replacement address program circuit 4a attains an L level, and output signal /RAa of NAND circuit 5a attains an H level. In this case, a word line in memory cell array block 1a or 1b is selected to have data read out by an operation similar to that in a redundancy de-selected state.

When the address specified by predecode signals PXA and PZA matches the replacement address programmed in replacement address program circuit 4a, the output of replacement address program circuit 4a attains an H level, and output signal /RAa of NAND circuit 5a attains an L level. As a result, decoder inactivation signal DA is pulled down to an L level, whereby decoders 2a and 2b are rendered inactive. Therefore, word lines WL in memory cell array block 1a and 1b are not selected.

When output signal /RAa of NAND circuit 5a attains an L level, redundant word line activation signal RAa attains an H level, whereby the potential of redundant word line RWLa is pulled up to an H level. This causes data to be read out from memory cell MC connected to redundant word line RWLa to a corresponding bit line pair BL.

Redundant word line activation signal RAa is applied from sense amplifier activation circuit 8a to sense amplifier unit 13a as sense amplifier activation signal SAa, whereby sense amplifier 13a is rendered active.

As a result, data read out to bit line pair BL is amplified by the sense amplifier in sense amplifier unit 13a. The decoder in sense amplifier unit 13a responds to predecode signal PYA to render conductive one of the plurality of transfer gates. As a result, one data is output.

As described in the above embodiments, when none of redundant word lines RWLa, RWLb, . . . is used, each of replacement address program circuits 4a–4d selects a predecode signal that is not selected by the other replacement address program circuits. Therefore, the load of all the predecode signals become equal. As a result, the rising time or the falling time of all the predecode signals is equal to each other.

When a defective bit is to be replaced by means of a redundant word line, i.e. when the address specified by predecode signals PXA and PZA matches the programmed replacement address, selection of a redundant word line is carried out independent of a block select signal. Here, all memory cell array blocks attain an inactive state regardless of selection of a redundant word line. Therefore, a defective bit can be replaced with a redundant word line of a different memory block.

The present invention is not limited to the above embodiment in which a semiconductor memory device is described.

For example, in the above embodiment, address signals XA, YA and ZA are predecoded in order to reduce the number of transistors forming decoders 2a and 2b. However, the address signals XA, YA and ZA may be supplied directly to corresponding circuit portions. In this case, replacement address program circuit 4a will select and output one of a plurality of address signals.

Furthermore, in the above embodiment, four replacement address program circuits 4a–4d are provided with respect to four predecode signals X0·X1, X0·/X1, X0·X1, and /X0·/X1 as shown in FIG. 1, so that each of replacement address program circuits 4a–4d selects corresponding one predecode signal when a redundant word line is not used. However, when eight replacement address program circuits (not shown) are provided with respect to four predecode signals, two replacement address program circuits are to select one predecode signal. Thus, the number of replacement address program circuits selecting one predecode signal will become equal to the number of another replacement address program circuits selecting another one predecode signal.

When six replacement address program circuits are provided with respect to four predecode signals, the load of all the predecode signals cannot be made equal since the number of replacement address program circuits selecting each predecode signal cannot be made equal to each other. However, as long as at least one replacement address program circuit is set to select a predecode signal other than a predecode signal selected by another one replacement address program circuit, there is no possibility of the rising time or falling time of one predecode signal being significantly increased.

The present invention is not limited to the above embodiments where one of redundant word lines RWLa, RWLb is provided corresponding to each of memory cell array blocks 1a, 1b, and a plurality of redundant word lines may be provided corresponding to each of memory cell array blocks 1a, 1b.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
 (a) a plurality of memory cell array blocks, including
  a plurality of select lines, and
  a plurality of memory cells connected to said plurality of select lines and arranged in a matrix of rows and columns,
 (b) a plurality of first select means provided corresponding to said plurality of memory cell array blocks, each responsive to externally applied plurality of address signals for selecting any of the plurality of select lines in a corresponding memory cell array block,
 (c) a plurality of redundant select lines, any of said plurality of redundant select lines being provided corresponding to each of said plurality of memory cell array blocks,
 (d) a plurality of redundant memory cells connected to said plurality of redundant select lines,
 (e) a plurality of redundancy circuit means, each provided corresponding to one of said plurality of memory cell array blocks and including
  setting means having set in advance whether any corresponding redundant select line is to be used or not,
  program means, when in a first case where any corresponding redundant select line is not used, for selecting and outputting any of said plurality of address signals, and when in a second case where any corresponding redundant select line is to be used, for selecting and outputting an address signal specifying an address of a select line to be replaced with that redundant select line to be used, and second select means for selecting any corresponding redundant select line in response to outputs of said setting means and said program means, (f) inactivation means for inactivating said plurality of first select means in response to an output of said plurality of redundancy circuit means when any corresponding redundant select line is selected by any of said plurality of redundancy circuit means, wherein one program means of said plurality of redundancy circuit means selects an address signal other than an address signal selected by another one program means in said first case.

2. A semiconductor memory device comprising:

(a) a plurality of memory cell array blocks, including
a plurality of select lines, and
a plurality of memory cells connected to said plurality of select lines and arranged in a matrix of rows and columns, (b) a plurality of first select means provided corresponding to said plurality of memory cell array blocks, each responsive to externally applied plurality of address signals for selecting any of the plurality of select lines in a corresponding memory cell array block, (c) a plurality of redundant select lines, any of said plurality of redundant select lines being provided corresponding to each of said plurality of memory cell array blocks, (d) a plurality of redundant memory cells connected to said plurality of redundant select lines, (e) a plurality of redundancy circuit means, each provided corresponding to one of said plurality of memory cell array blocks and including
setting means having set in advance whether any corresponding redundant select lines is to be used or not,
program means having an address programmed of a select line to be replaced with any corresponding redundant select line,
second select means for selecting any corresponding redundant select line in response to outputs of said setting means and said program means, (f) inactivation means for inactivating said plurality of first select means in response to an output of said plurality of redundancy circuit means when any corresponding redundant select line is selected by any of said plurality of redundancy circuit means, wherein said plurality of address signals are applied to each said program means so that the loads of said plurality of address signals are substantially equal to each other when said any corresponding redundant select line is not used.

3. A semiconductor memory device comprising:

(a) a plurality of memory cell array blocks, including
a plurality of select lines, and
a plurality of memory cells connected to said plurality of select lines and arranged in a matrix of rows and columns, (b) predecode means for decoding externally applied plurality of address signals to generate a plurality of predecode signals, (c) a plurality of first select means provided corresponding to said plurality of memory cell array blocks, each responsive to said plurality of predecode signals for selecting any of a plurality of select lines in a corresponding memory cell array block, (d) a plurality of redundant select lines, any of said plurality of redundant select line provided corresponding to each of said plurality of memory cell array blocks, (e) a plurality of redundant memory cells connected to said plurality of redundant select lines, (f) a plurality of redundancy circuit means, each provided corresponding to one of said plurality of memory cell array blocks and including
setting means having set in advance whether any corresponding redundant select line is to be used or not,
program means, when in a first case where any corresponding redundant select line is not used, for selecting and outputting any of said plurality of predecode signals, and when in a second case where any corresponding redundant select line is used, for selecting and outputting a predecode signal specifying an address of a select line to be replaced with that redundant select line to be used, and
second select means responsive to outputs of said setting means and said program means for selecting any corresponding redundant select line and (g) inactivation means for inactivating said plurality of first select means in response to an output of said plurality of redundancy circuit means when any corresponding redundant select line is selected by any of said plurality of redundancy circuit means, wherein each program means in said plurality of redundancy circuit means selects a predecode signal other than a predecode signal selected by another program means in said first case.

4. A semiconductor memory device comprising:

(a) a plurality of memory cell array blocks, including
a plurality of select lines, and
a plurality of memory cells connected to said plurality of select lines and arranged in a matrix of rows and columns, (b) predecode means for decoding externally applied plurality of address signals to generate a plurality of predecode signals, (c) a plurality of first select means provided corresponding to said plurality of memory cell array blocks, each responsive to said plurality of predecode signals for selecting any of a plurality of select lines in a corresponding memory cell array block, (d) a plurality of redundant select lines, any of said plurality of redundant select lines being provided corresponding to each of said plurality of memory cell array blocks, (e) a plurality of redundant memory cells connected to said plurality of redundant select lines, (f) a plurality of redundancy circuit means, each provided corresponding to one of said plurality of memory cell array blocks and including
setting means having set in advance whether any corresponding redundant select line is to be used or not,
program means, having an address programmed of a select line to be replaced with any corresponding redundant select line,
second select means responsive to outputs of said setting means and said program means for selecting any corresponding redundant select line and (g) inactivation means for inactivating said plurality of first select means in response to an output of said plurality of redundancy circuit means when any corresponding redundant select line is selected by any of said plurality of redundancy circuit means, wherein said plurality of predecode signals are applied to each said program means so that the loads of said plurality of predecode signals are substantially equal to each other when said any corresponding redundant select line is not used.

5. A semiconductor memory device comprising:
(a) a plurality of memory cell array blocks, including
   a plurality of select lines, and
   a plurality of memory cells connected to said plurality of select lines and arranged in a matrix of rows and columns,
(b) predecode means for decoding externally applied plurality of address signals to generate a plurality of predecode signals,
(c) a plurality of first select means provided corresponding to said plurality of memory cell array blocks, each responsive to said plurality of predecode signals for selecting any of the plurality of select lines in a corresponding memory cell array block,
(d) a plurality of redundant select lines, any of said plurality of redundant select lines being provided corresponding to each of said plurality of memory cell array blocks,
(e) a plurality of redundant memory cells connected to said plurality of redundant select lines,
(f) a plurality of redundancy circuit means, each provided corresponding to one of said plurality of memory cell array blocks and including
   setting means having set in advance whether any corresponding redundant select line is to be used or not,
   program means, when in a first case where any corresponding redundant select line is not used, for selecting and outputting any of said plurality of predecode signals, and when in a second case where any corresponding redundant select line is used, for selecting and outputting a predecode signal specifying an address of a select line to be replaced with that redundant select line to be used, and
   second select means responsive to outputs of said setting means and said program means for selecting any corresponding redundant select line, and
(g) inactivation means for inactivating said plurality of first select means in response to an output of said plurality of redundancy circuit means when any corresponding redundant select line is selected by any of said plurality of redundancy circuit means, wherein the number of program means selecting one predecode signal is set equal with respect to the number of another program means selecting another one predecode signal when in said first case.

6. A semiconductor memory device comprising:
(a) a plurality of memory cell array blocks, including
   a plurality of select lines, and
   a plurality of memory cells connected to said plurality of select lines and arranged in a matrix of rows and columns,
(b) predecode means for decoding externally applied plurality of address signals to generate a plurality of predecode signals,
(c) a plurality of first select means provided corresponding to said plurality of memory cell array blocks, each responsive to said plurality of predecode signals for selecting any of a plurality of select lines in a corresponding memory cell array block,
(d) a plurality of redundant select lines, any of said plurality of redundant select lines being provided corresponding to each of said plurality of memory cell array blocks,
(e) a plurality of redundant memory cells connected to said plurality of redundant select lines,
(f) a plurality of redundancy circuit means, each provided corresponding to one of said plurality of memory cell array blocks, and including
   (f1) first setting means having set in advance whether any corresponding redundant select line is to be used or not,
   (f2) program means including
      second setting means having an address set of a select line to be replaced with any corresponding redundant select line, and
      signal select means responsive to an output of said second setting means for selecting and outputting any of said plurality of predecode signals,
   (f3) second select means responsive to outputs of said first setting means and said signal select means for selecting any corresponding redundant select line, and
(g) inactivation means for inactivating said plurality of first select means in response to an output of said plurality of redundancy circuit means when any corresponding redundant select line is selected by any of said plurality of redundancy circuit means, wherein one program means in said plurality of redundancy circuit means selects a predecode signal other than a predecode signal selected by another one program means when said plurality of redundant select lines are not used.

7. The semiconductor memory device according to claim 6, wherein said second setting means comprises
upper setting means for generating a first logic control signal, and
lower setting means for generating a second logic control signal,
wherein said signal select means comprises
   first upper transfer gate means for transferring one of said plurality of predecode signals when said first logic control signal attains a first logic level,
   second upper transfer gate means for transferring another one of said plurality of predecode signals when said first logic control signal attains a second logic level,
   third upper transfer gate means for transferring a further another one of said plurality of predecode signals when said first logic control signal attains the first logic level,
   fourth upper transfer gate means for transferring still another one of said plurality of predecode signal when said first logic control signal attains the second logic level,
   first lower transfer gate means for transferring an output signal of said first upper transfer gate means when said second logic control signal attains the first logic level,
   second lower transfer gate means for transferring an output signal of said second upper transfer gate means when said second logic control signal attains the first logic level,
   third lower transfer gate means for transferring an output signal of said third upper transfer gate means when said second logic control signal attains the second logic level, and fourth lower transfer gate means for transferring an output signal of said fourth upper transfer gate means when said second logic control signal attains the second logic level.

8. A semiconductor memory device comprising:

(a) a plurality of memory cell array blocks including
a plurality of select lines
a plurality of memory cells connected to said plurality of select lines and arranged in a matrix of rows and columns, (b) predecode means for decoding externally applied plurality of address signals for generating a plurality of predecode signals, (c) a plurality of first select means provided corresponding to said plurality of memory cell array blocks, each responsive to said predecode signal for selecting any of a plurality of select lines in a corresponding memory cell array block, (d) a plurality of redundant select lines, any of said plurality of redundant select lines being provided corresponding to each of said plurality of memory cell array blocks, (e) a plurality of redundant memory cells connected to said plurality of redundant select lines, (f) a plurality of redundancy circuit means, each provided corresponding to one of said plurality of memory cell array blocks, and including (f1) first setting means having set in advance whether any corresponding redundant select line is to be used or not, (f2) program means including
second setting means having an address set of a select line to be replaced with any corresponding redundant select line, and
a plurality of transfer means each responsive to an output of said second setting means for transferring a corresponding one of said plurality of predecode signals, and (f3) second select means responsive to outputs of said first setting means and said plurality of transfer means for selecting any corresponding redundant select line, and (g) inactivation means for inactivating said plurality of first select means in response to an output of said plurality of redundancy circuit means when any corresponding redundant select line is selected by any of said plurality of redundancy circuit means, wherein one of the plurality of transfer means in one of said plurality of redundancy circuit means transfers a predecode signal other than a predecode signal transferred by one of the plurality of transfer means in another one redundancy circuit means when said plurality of redundant select lines are not used.

* * * * *